US009252292B2

(12) United States Patent
Schulze

(10) Patent No.: US 9,252,292 B2
(45) Date of Patent: Feb. 2, 2016

(54) SEMICONDUCTOR DEVICE AND A METHOD FOR FORMING A SEMICONDUCTOR DEVICE

(71) Applicant: Infineon Technologies AG, Neubiberg (DE)

(72) Inventor: Hans-Joachim Schulze, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 40 days.

(21) Appl. No.: 14/027,953

(22) Filed: Sep. 16, 2013

(65) Prior Publication Data

US 2015/0076650 A1    Mar. 19, 2015

(51) Int. Cl.
| | |
|---|---|
| *H01L 31/058* | (2006.01) |
| *H01L 29/861* | (2006.01) |
| *H01L 21/22* | (2006.01) |
| *H01L 23/34* | (2006.01) |

(52) U.S. Cl.
CPC .............. *H01L 29/861* (2013.01); *H01L 21/22* (2013.01); *H01L 23/34* (2013.01); *H01L 2924/0002* (2013.01)

(58) Field of Classification Search
CPC . H01L 29/0804; H01L 27/075; H01L 27/077; H01L 27/0823; H01L 21/22; H01L 23/34; H01L 29/861
USPC ........... 257/47, 144, 163, 197, 205, 370, 474, 257/467; 438/170, 189, 202, 203, 309
See application file for complete search history.

(56) References Cited

U.S. PATENT DOCUMENTS

| 6,043,516 A | 3/2000 | Schulze |
| 8,343,862 B2 | 1/2013 | Schulze et al. |

(Continued)

FOREIGN PATENT DOCUMENTS

DE    102007017788 A1    10/2008

OTHER PUBLICATIONS

Matthias, S., et al., "Inherently Soft Free-Wheeling Diode for High Temperature Operation," Proceedings of the 25th International Symposium on Power Semiconductor Devices & ICs, May 29, 2013, pp. 335-338, Kanazawa, Japan.

*Primary Examiner* — Jarrett Stark
*Assistant Examiner* — Shahed Ahmed
(74) *Attorney, Agent, or Firm* — Murphy, Bilak & Homiller, PLLC

(57) ABSTRACT

A semiconductor device includes a semiconductor substrate. The semiconductor substrate includes a first doping region arranged at a main surface of the semiconductor substrate, an emitter layer arranged at a back side surface of the semiconductor substrate, at least one first conductivity type area separated from the first doping region by a second doping region of the semiconductor substrate and at least one temperature-stabilizing resistance area. The first doping region has a first conductivity type and the emitter layer has at least mainly a second conductivity type. The second doping region has the second conductivity type and the at least one first conductivity type area has the first conductivity type. The at least one temperature-stabilizing resistance area is located within the second doping region and adjacent to the at least one first conductivity type area. Further, the at least one temperature-stabilizing resistance area has a lower variation of a resistance over a range of an operating temperature of the semiconductor device than at least a part of the second doping region located adjacent to the at least one temperature-stabilizing resistance area.

18 Claims, 5 Drawing Sheets

(56) References Cited

U.S. PATENT DOCUMENTS

| | | | |
|---|---|---|---|
| 8,379,684 B1 * | 2/2013 | Bhat | H01L 33/02 257/13 |
| 2001/0005036 A1 | 6/2001 | Porst et al. | |
| 2002/0048855 A1 * | 4/2002 | Matsudai | H01L 27/0623 438/135 |
| 2007/0170514 A1 * | 7/2007 | Mauder | H01L 29/0834 257/370 |

* cited by examiner

SEMICONDUCTOR DEVICE AND A METHOD FOR FORMING A SEMICONDUCTOR DEVICE

TECHNICAL FIELD

Embodiments relate to measures for increasing the durability or life-cycle of semiconductor devices and in particular to a semiconductor device and a method for manufacturing a semiconductor device.

BACKGROUND

The durability and life cycle of a semiconductor device is often affected by voltage peaks or current peaks during switch-off of the semiconductor device. For example, large currents can occur during the shutdown of power semiconductors (e.g. comprising blocking voltages above 100 V). It is desired to decrease the risk of destruction due to high currents in order to increase the durability or life cycle of semiconductor devices, for example.

SUMMARY

Some embodiments relate to a semiconductor device with a semiconductor substrate. The semiconductor substrate comprises a first doping region arranged at a main surface of the semiconductor substrate, an emitter layer arranged at a back side surface of the semiconductor substrate, at least one first conductivity type area separated from the first doping region by a second doping region of the semiconductor substrate and at least one temperature-stabilizing resistance area. The first doping region comprises a first conductivity type and the emitter layer comprises at least mainly a second conductivity type. The second doping region comprises the second conductivity type and the at least one first conductivity type area comprises the first conductivity type. The at least one temperature-stabilizing resistance area is located within the second doping region and adjacent to the at least one first conductivity type area. Further, the at least one temperature-stabilizing resistance area comprises a lower variation of a resistance over a range of an operating temperature of the semiconductor device than at least a part of the second doping region located adjacent to the at least one temperature-stabilizing resistance area.

Some embodiments relate to a semiconductor diode device with a semiconductor substrate. The semiconductor substrate comprises a first doping region arranged at a main surface of the semiconductor substrate, an emitter layer arranged at the back side surface of the semiconductor substrate, at least one first conductivity type area located at the back side surface within the emitter layer and at least one temperature-stabilizing resistance area. The first doping region is in contact with a front side metal layer of the semiconductor diode device and comprises a first conductivity type. The emitter layer is in contact with a back side metal layer of the semiconductor diode device and comprises at least mainly a second conductivity type. Further, the at least one first conductivity type area comprises the first conductivity type and the at least one first conductivity type area is separated from the first doping region by a second doping region comprising the second conductivity type. The at least one temperature-stabilizing resistance area is located within the second doping region and adjacent to the at least one first conductivity type area. Further, the at least one temperature-stabilizing resistance area comprises a doping causing energy states with a distance to the conduction band and to the valence band of the semiconductor material of the semiconductor substrate of more than 150 meV or an average defect density within the at least one temperature-stabilizing resistance area is more than twice an average defect density within at least a part of the second doping region located adjacent to the at least one temperature-stabilizing resistance area.

BRIEF DESCRIPTION OF THE FIGURES

Some embodiments of apparatuses and/or methods will be described in the following by way of example only, and with reference to the accompanying figures, in which.

DETAILED DESCRIPTION

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Figure 1:
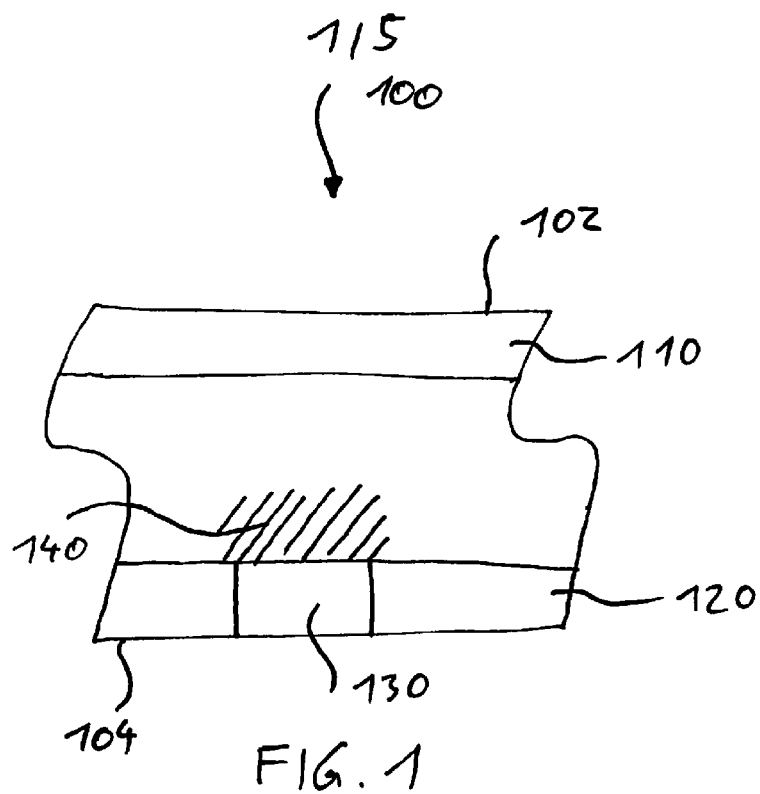
FIG. 1 shows a schematic cross-section of a part of a semiconductor device.

FIG. 1 shows a schematic cross-section of a part of a semiconductor device 100 with a semiconductor substrate according to an embodiment. The semiconductor substrate comprises a first doping region 110 arranged at the main surface 102 of the semiconductor substrate, an emitter layer 120 arranged at a back side surface 104 of the semiconductor substrate, at least one first conductivity type area 130 separated from the first doping region 110 by a second doping region of the semiconductor substrate and at least one temperature-stabilizing resistance area 140. The first doping region 110 comprises a first conductivity type and the emitter layer 120 comprises at least mainly a second conductivity type. Further, the second doping region comprises the second conductivity type and the at least one first conductivity type area 130 comprises the first conductivity type. The at least one temperature-stabilizing resistance area 140 is located within the second doping region and adjacent to the at least one first conductivity type area 130. Further, the at least one temperature-stabilizing resistance area 140 comprises a lower variation of a resistance over a range of an operating temperature of the semiconductor device 100 than at least a part of the second doping region located adjacent to the at least one temperature-stabilizing resistance area 140.

By implementing the at least one first conductivity type area, the softness (e.g. reducing the fast changes of the current over time) during a switch-off process of a semiconductor device can be improved. This softness may be provided over a large temperature range by implementing at least one temperature-stabilizing resistance area adjacent to the at least one first conductivity type area. In this way, a soft switch-off behavior of the semiconductor device may be provided. Consequently, the durability or life cycle of the semiconductor device may be improved.

The semiconductor device 100 may be implemented by any semiconductor processing technology capable of forming the mentioned structures, for example. In other words, the semiconductor substrate of the semiconductor device 100 may be a silicon-based semiconductor substrate, a silicon carbide-based semiconductor substrate, a gallium arsenide-based semiconductor substrate or a gallium nitride-based semiconductor substrate, for example.

The first doping region 110 and the at least one first conductivity type area 130 comprise the first conductivity type (e.g. p or n) and the emitter layer 120 and the second doping region comprise at least mainly the second conductivity type (e.g. n or p). In other words, the first doping region 110 and the at least one first conductivity type area 130 comprise the first conductivity type which can be a p-doping (e.g. caused by incorporating aluminum ions or boron ions) or an n-doping (e.g. caused by incorporating nitrogen ions, phosphor ions or arsenic ions). Consequently, the second conductivity type indicates an opposite n-doping or p-doping. In other words, the first conductivity type may indicate an p-doping and the second conductivity type may indicate a n-doping or vice-versa.

The emitter layer 120 comprises mainly the second conductivity type, if the part of the semiconductor structure occupied by the emitter layer 120 comprises a doping of the second conductivity type over more than 50% (or more than 70%, more than 80% or more than 90%) of the volume occupied by the emitter layer 120, for example. For example, the at least one first conductivity type area 130 may be a part of the emitter layer 120 (as shown in FIG. 1) comprising the first conductivity type reducing the percentage of volume of the emitter layer 120 comprising the second conductivity type.

The first doping region 110 is arranged or located at a main surface 102 of the semiconductor substrate of the semiconductor device 100. In other words, at least a part of the first doping region 110 built up a portion of the main surface 102 or is located at the main surface 102.

A main surface 102 of the semiconductor substrate may be a semiconductor surface of the semiconductor substrate towards metal layers, insulation layers and/or passivation layers on top of the semiconductor surface. In comparison to a basically vertical edge (e.g. resulting from separating the semiconductor substrate from others) of the semiconductor substrate, the main surface 102 of the semiconductor substrate may be a basically horizontal surface extending laterally. The main surface 102 of the semiconductor substrate may be a basically even plane (e.g. neglecting unevenness of the semiconductor structure due to the manufacturing process or trenches). In other words, the main surface 102 of the semiconductor substrate may be the interface between the semiconductor material and an insulation layer, metal layer or passivation layer on top of the semiconductor substrate.

Further, a lateral direction or lateral expansion may be oriented basically in parallel to the main surface 102 and a vertical direction or vertical expansion may be oriented basically orthogonal to the main surface 102.

The emitter layer 120 is arranged at a back side surface 104 of the semiconductor device. The back side surface 104 of the semiconductor substrate is the surface of the semiconductor material of the semiconductor substrate located opposite to the main surface 102 of the semiconductor substrate. The back side surface 104 may be a semiconductor surface of the semiconductor substrate towards a back side metal layer, a back side insulation layer or a back side passivation layer. Consequently, the back side surface 104 may also be a basically horizontal surface extending laterally and may be basically an even plane (e.g. neglecting unevenness due to the manufacturing process).

In other words, the emitter layer 120 may build up the back side surface 104 of the semiconductor substrate or is located at the back side surface 104 of the semiconductor substrate. Further, the emitter layer 120 may represent a lateral layer of the semiconductor substrate.

The emitter layer 120 may emit charge carriers (electrons or holes) towards the main surface 102 of the semiconductor substrate in an on-state of the semiconductor device 100.

The at least one first conductivity type area 130 is located within the second doping region of the semiconductor substrate. The second doping region may extend over a large portion of the semiconductor substrate. For example, the second doping region may also contain the emitter layer 120 or at least the parts of the emitter layer comprising the second conductivity type. The second doping region is located at least at the side of the at least one first conductivity type area 130 towards the first doping region 110 (the main surface) so that the at least one first conductivity type area 130 and the first doping region 110 are separated from each other by the second doping region. In other words, the second doping region may extend farther towards the main surface 102 (in the vertical direction) than the emitter layer 120. For example, the second doping region may contain a field stop layer and/or a drift layer of the semiconductor device 100 as well as at least a part of the emitter layer 120 comprising the second conductivity type.

The at least one temperature-stabilizing resistance area 140 is located within the second doping region. In other words, the at least one temperature-stabilizing resistance area is a part of the second doping region with adapted physical properties regarding the temperature-dependency of the resistance of the semiconductor material located within the at least one temperature-stabilizing resistance area 140 in comparison to the surrounding semiconductor material of the second doping region. The at least one temperature-stabilizing resistance area 140 may be a part of the second doping region located adjacent to the at least one first conductivity type area at least at a side of the at least one first conductivity type area arranged towards the main surface 102 of the semiconductor substrate. In other words, at least the side of the at least one first conductivity type area facing the main surface 102 of the semiconductor substrate may be arranged adjacent to the at least one temperature-stabilizing resistance area 140. Consequently, a current (of electrons or holes) directed from the main surface 102 to the back side surface 104 or from the back side surface 104 to the main surface 102 crossing the at least one temperature-stabilizing resistance area is influenced by a very stable or nearly constant resistance over a predefined temperature range.

The at least one temperature-stabilizing resistance area 140 is implemented in a way so that a variation of a resistance over a range of an operating temperature of the semiconductor device 100 within the at least one temperature-stabilizing resistance area 140 is lower than within at least a part of the second doping region located adjacent to the at least one temperature-stabilizing resistance area 140 (e.g. the remaining emitter layer, a remaining field stop layer or a remaining drift layer). In other words, the temperature-dependency of the resistance of the at least one temperature-stabilizing resistance area is stabilized (e.g. by increasing the defect density or implementing deep energy states) in comparison to the surrounding second doping region.

The variation of the resistance of the at least one temperature-stabilizing resistance area 140 may be defined by a difference between a maximal and a minimal resistance of the at least one temperature-stabilizing resistance area 140 over the range of the operating temperature or an averaged variation of the resistance of the at least one temperature-stabilizing resistance area 140 over the range of the operating temperature (e.g. root mean square), for example.

The range of the operating temperature of the semiconductor device 100 may be a predefined temperature range representing a nominal temperature range in an on state of the semiconductor device 100 or the range from a minimal temperature (e.g. −40° C.) to a maximal temperature (e.g. 175° C.) of the semiconductor device 100 in an operating state (e.g. on state and off state) of the semiconductor device 100.

An on-state of the semiconductor device 100 may be a state, in which the semiconductor device 100 provides a maximal overall current under normal or intended operation conditions of the semiconductor device 100 or provides a nominal current (e.g. according to the specification of the device). A nominal current may be a current, which the device is able to provide in an on-state for more than 50% (or more than 70% or more than 90%) of a life time to be reached by the device, for example.

By implementing the at least one first conductivity type area, the softness of the switch-off process (e.g. reducing a maximal current change per time) can be improved and by implementing at least one temperature-stabilizing resistance area 140 at least adjacent to the at least one first conductivity type area 130, an improved softness can be provided over the range of the operating temperature of the semiconductor device 100, for example.

The semiconductor device 100 may comprise an arbitrary number of temperature-stabilizing resistance areas located adjacent to the same number of first conductivity type areas. Alternatively, the at least one temperature-stabilizing resistance area 130 may extend laterally over more than one first conductivity type areas 130 so that the number of temperature-stabilizing resistance areas 140 is lower than the number of first conductivity type areas 130. For example, a plurality of first conductivity type areas may be located with equal or varying distance to each other distributed laterally over a part of the emitter layer 120 (e.g. cell area of the semiconductor device) or the whole emitter layer 120 and a single temperature-stabilizing resistance area (layer) extends along the emitter layer 120 so that the single temperature-stabilizing resistance area is located adjacent to each of the first conductivity type areas 130 at least at a side of the first conductivity type areas arranged towards the main surface 102. This may mean, that the temperature-stabilizing resistance extends over the whole lateral direction of the chip and may form at least a part of the field-stop layer.

The at least one first conductivity type area 130 can be arranged at various locations within the second doping region. For example, the at least one first conductivity type area 130 is located within the emitter layer (representing a part of the second doping region) at the back side surface 104 of the semiconductor substrate (as shown in FIG. 1). In other words, the at least one first conductivity type area 130 can be connected to the same electrical potential as the remaining emitter layer 120 (e.g. by a back side metal layer) at the back side 104 of the semiconductor substrate. In this way, the at least one first conductivity type area 130 may be able to improve the softness of the switch-off of a semiconductor diode or semiconductor field effect transistor device, for example.

The at least one first conductivity type area 130 may comprise a thickness lower than the emitter layer 120 (e.g. so that the emitter layer separates the at least one first conductivity type area from a field stop layer or a drift layer of the second doping region) or the at least one first conductivity type area 130 may reach through the emitter layer 120. For example, the semiconductor substrate may comprise a field stop layer and/or a drift layer adjacent to the emitter layer 120 and the at least one first conductivity type area 130 reaches from the back side surface 104 of the semiconductor substrate to the field stop layer or the drift layer.

Alternatively, the at least one first conductivity type area can be completely enclosed by the second doping region (e.g. containing the emitter layer and a field stop layer and/or drift layer) of the semiconductor substrate.

Figure 2:
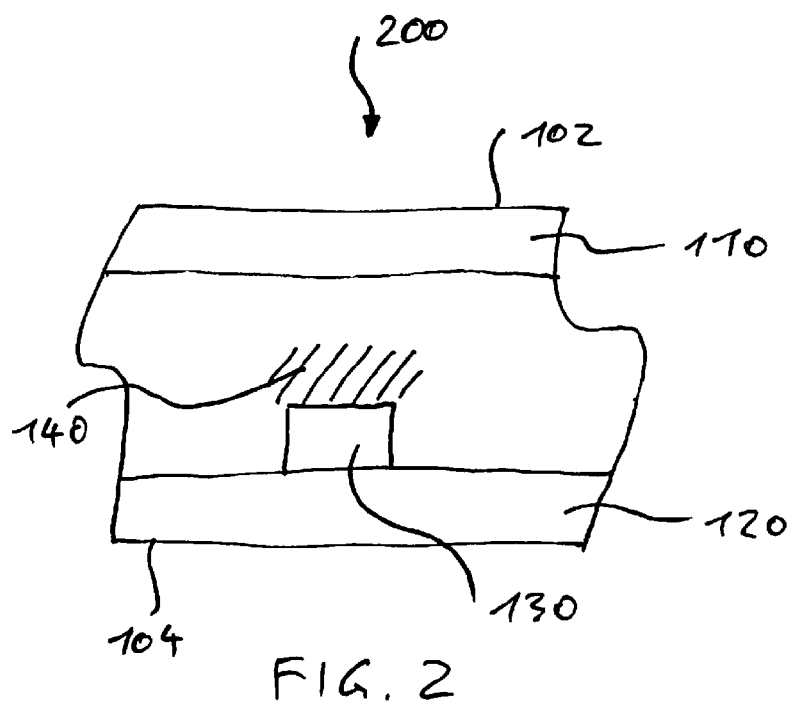
FIG. 2 shows a schematic cross-section of a part of a further semiconductor device.

FIG. 2 shows a schematic cross-section of a semiconductor device 200 according to an embodiment. The implementation of the semiconductor device 200 is similar to the implementation shown in FIG. 1. However, the at least one first conductivity type area 130 is located adjacent to the emitter layer 120 and is completely enclosed by the second doping region or a field stop region or a region 140. In other words, the at least one first conductivity type area 130 is surrounded by a pn-junction to the second doping region and represents a floating region, for example.

Figure 3:
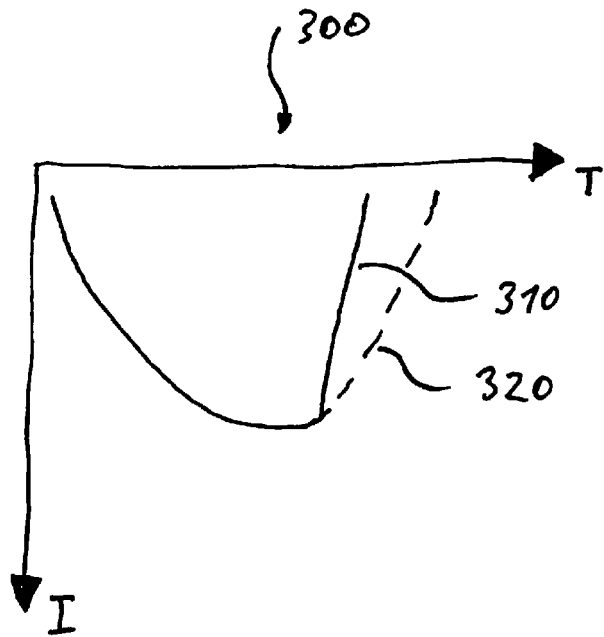
FIG. 3 shows a schematic diagram indicating a current over time during switch-off.

FIG. 3 schematically illustrates the switch-off behavior of diodes by a diagram indicating a current I over time T diagram. For a diode without softness improvement measures 310, the current decreases very fast causing large voltages (e.g. U~dI/dT), which may damage of the semiconductor device. In comparison, for a diode 320 with implemented first conductivity type areas 130 within the emitter layer 120, the decrease of the current during the switch-off process can be relaxed due to a carrier injection from the first conductivity type area 130 as soon as a sufficient voltage drop occurs at the side of the first conductivity type area 130 arranged towards the main surface 102. The voltage drop depends on the resistance at this side, which is normally strongly temperature dependent. This temperature-dependency can be avoided or significantly reduced by implementing the temperature-stabilizing resistance area 140.

After the carrier injection from the first conductivity type area 130 is excited or occurs, additionally the depletion zone of the pn-junction of the diode may move slightly back towards the main surface 102 of the semiconductor device.

The stabilizing of the temperature-dependency of the resistance of the at least one temperature-stabilizing resistance area 140 can be reached in various ways.

For example, deep energy states can be implemented in the at least one temperature-stabilizing resistance area 140. In other words, the at least one temperature-stabilizing resistance area 140 may comprise a doping causing or resulting in energy states with a distance to the conduction band and to the valence band of the semiconductor material (e.g. doped silicon, doped silicon carbide, doped gallium arsenide) of the semiconductor substrate of more than 150 meV (or more than 200 meV, more than 250 meV or more than 300 meV). In this way, an increase in temperature causes additional free charge carriers from the deep energy states resulting in a reduction of the resistance within the temperature-stabilizing resistance area 140, which at least partly compensates the normally-occurring increase of the resistance of a semiconductor material by increasing temperature due to phonon scattering, for example. Further, the number of additional charge carriers can be influenced by the selection of the height of the doping concentration. Consequently, the variation of the resistance over a range of an operating temperature of the semiconductor device can be reduced. In this way, an improved softness of the switch-off process may be provided over a predefined temperature range so that the durability or life cycle of the semiconductor device may be increased.

The implementation of deep energy states at a single energy may be sufficient for a significant stabilization of the temperature-dependency of the resistance. Alternatively, deep energy states at more than one energy may be implemented. For example, the at least one temperature-stabilizing resistance area 140 may comprise a doping of a chemical element (e.g. selenium) causing at least two different energy states with a distance to the conduction band and to the valence band of the semiconductor material of the semiconductor substrate of more than 150 meV (or more than 200 meV, more than 250 meV or more than 300 meV). Alternatively, a doping with more than one chemical element causing or resulting in energy states with a distance to the conduction band and to the valence band of the semiconductor material of the semiconductor substrate of more than 150 meV can be used (e.g. sulfur and selenium). In this way, the temperature-dependency of the resistance may be further stabilized, since additional charge carriers are provided at various energies corresponding to different temperatures.

For example, the at least one temperature-stabilizing resistance area 130 may comprise a doping of selenium, sulfur and/or indium. Selenium and sulfur may cause deep energy states closer to the conduction band than to the valence band and indium may cause an energy state closer to the valence band than to the conduction band, for example.

Additionally, one or more flat energy states can be implemented for providing a fine tuning of the temperature-dependency of the resistance of the temperature-stabilizing resistance area 140. In other words, the at least one temperature-stabilizing resistance area 140 may comprise a doping causing energy states with a distance to the conduction band or to the valence band of the semiconductor material of the semiconductor substrate of less than 100 meV (or less than 60 meV or less than 40 meV). For example, the at least one temperature-stabilizing resistance area may comprise a doping of phosphor, arsenic (e.g. implementing energy states close to the conduction band), boron or aluminum (e.g. causing energy states close to the valence band) or proton-irradiation-induced donor levels.

The dopants may be implemented into the temperature-stabilizing resistance area 140 by a masked or unmasked implant resulting in a layer or local areas, for example. The doping of atoms causing energy states with a distance to the conduction band and to the valence band of the semiconductor material of the semiconductor substrate of more than 150 meV may reach into a depth between 0.3 µm and 40 µm (or 0.8 µm and 20 µm) from the back side surface 104 of the semiconductor substrate, for example.

For example, the doping of atoms causing energy states with a distance to the conduction band or to the valence band of the semiconductor material of the semiconductor substrate of less than 60 meV reaches into a depth between 0.3 µm and 40 µm (or 0.8 µm and 20 µm) from the back side surface 104 of the semiconductor substrate.

Figure 4:
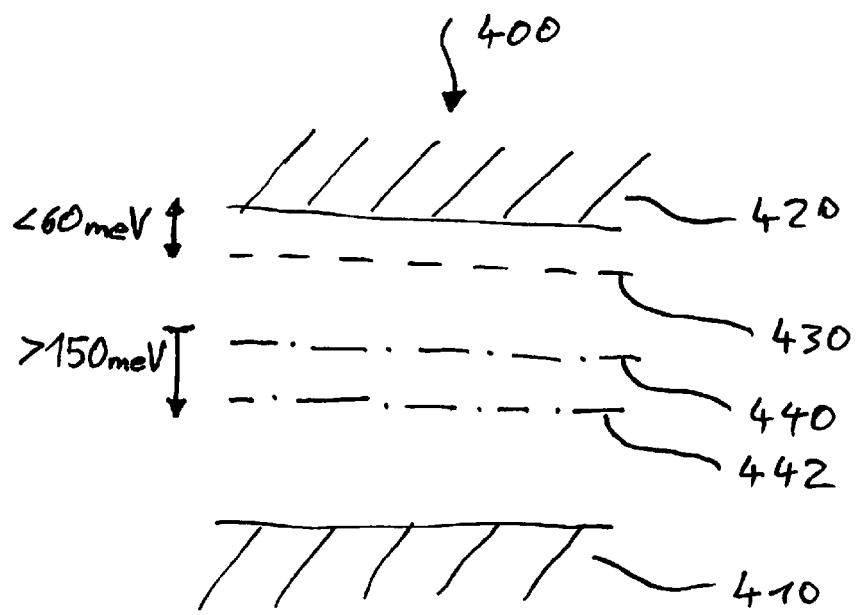
FIG. 4 shows a schematic illustration of a band structure of a temperature-stabilizing resistance area.

FIG. 4 shows a schematic illustration of the band structure of the semiconductor material within a temperature-stabilizing resistance area for an n-doped seconding doping region. The valence band 410 is shown at the bottom and the conduction band 420 is shown at the top. Further, an energy state 430 with a distance to the conduction band 420 of less than 60 meV (e.g. implemented by a phosphor or arsenic doping) and two energy states 440, 442 with a distance to the conduction band 420 of more than 150 meV (e.g. implemented by a selenium or sulfur doping) are shown.

The ratio of dopants causing deep energy states and flat energy states within the at least one temperature-stabilizing resistance area 140 can be varied or selected in a wide range. In this way, the temperature-dependency of the resistance of the temperature-stabilizing resistance area 140 can be adapted to the kind of semiconductor device (e.g. diode or field effect transistor) and/or the range of the operating temperature of the semiconductor device. For example, for devices with higher operating temperatures, more dopants causing deep energy states can be implemented than for semiconductor devices with lower operating temperatures.

For example, between 20% and 80% (or 40% to 60%) of the dopants of the doping of the at least one temperature-stabilizing resistance area 140 may cause energy states with a distance to the conduction band and to the valence band of the semiconductor material of the semiconductor substrate of more than 150 meV. The remaining dopants may be dopants causing energy states with a distance to the conduction band or to the valence band of the semiconductor material of the semiconductor substrate of less than 100 meV, for example.

Alternatively, or additionally to one or more of the aspects mentioned above, the temperature-dependency of the resistance within the temperature-stabilizing resistance area 140 may be stabilized by increasing the defect density within the at least one temperature-stabilizing resistance area 140. In other words, an average defect density (e.g. averaged over the volume of the temperature-stabilizing resistance area) within the at least one temperature-stabilizing resistance area 140 may be more than twice (or more than five times or more than ten times) an average defect density (e.g. averaged over a part of the second doping region, for example a remaining field stop layer or drift layer) within at least the part of the second doping region located adjacent to the at least one temperature-stabilizing resistance area 140. In this way, the mobility within the temperature-stabilizing resistance area is very low and the portion of the resistance influenced by the temperature (phonon scattering) is low compared to the absolute value of the resistance.

Such a reduction of the mobility of the free charge carriers by a targeted scattering center generation can be implemented by a masked or an all-over helium irradiation, for example. Alternatively, also other highly-energetic particles, such as carbon, oxygen or protons may be used for the irradiation.

Alternatively, the resistance or the defect density may also be increased by implanting non-doping impurities (e.g. germanium).

In other words, defects may be crystal defects of the semiconductor like vacancies, dislocations, stacking faults or impurities of non-doping chemical elements, for example.

The high resistance caused by the increased defect density within the temperature-stabilizing resistance area 140 may be reduced to a desired resistance by increasing a doping concentration within the at least one temperature-stabilizing resistance area 140 in comparison to a non-irradiated resistance area 140. In this case, an average doping concentration (e.g. averaged over the temperature-stabilizing resistance area) within the at least one temperature-stabilizing resistance area may be more than twice (or more than ten times or more than hundred times) a doping concentration within at least the part of the second doping region located adjacent to the at least one temperature-stabilizing resistance area 140 (e.g. averaged over a part of the second doping region, for example a remaining field stop layer or drift layer).

Optionally, additionally or alternatively to one or more aspects mentioned above, the second doping region may comprise at least a field stop layer arranged adjacent to the emitter layer 120 and a drift layer arranged between the field stop layer and the first doping region 110, wherein the temperature-stabilizing resistance area 140 may be part of this field stop layer or may even form this field stop layer.

Further, optionally, additionally or alternatively to one or more aspects mentioned above, the semiconductor device may comprise a back side metal layer in contact with the emitter layer 120 for connecting the emitter layer 120 electrically to an external device. Further optionally, the semiconductor device may comprise a front side metal layer (power metal) in contact with the first doping region 110 for connecting the first doping region 110 electrically to an external device, for example.

Some embodiments relate to a semiconductor diode device (e.g. silicon diode or silicon carbide diode) or a semiconductor field effect transistor device (e.g. double diffused metal oxide semiconductor field effect transistor). In other words, a semiconductor device according to the described concept or one or more embodiments described above may implement a semiconductor diode device or a semiconductor field effect transistor device, for example.

Figure 5A:
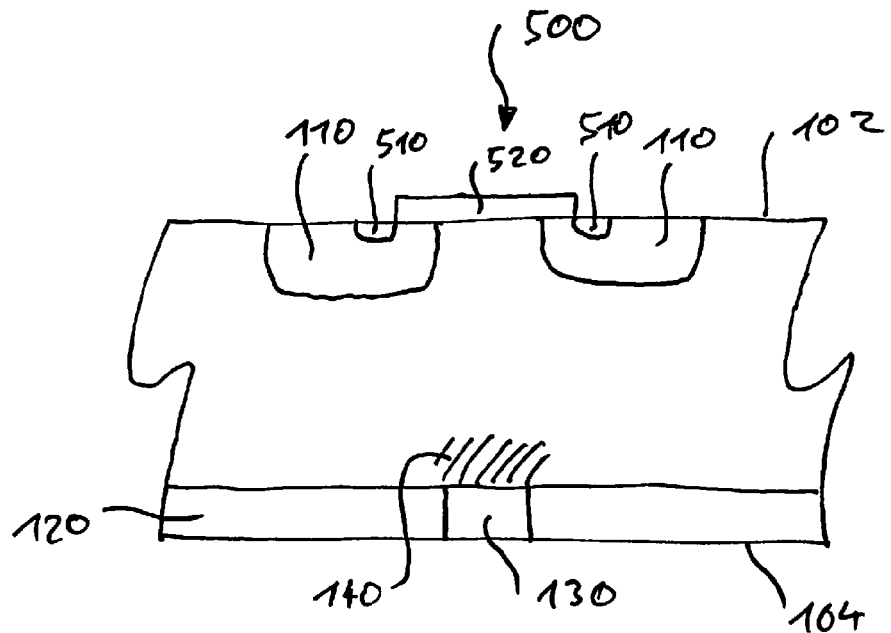
FIG. 5a shows a schematic cross-section of a part of a semiconductor device.

FIG. 5a shows a schematic illustration of a semiconductor field effect transistor device 500 according to an embodiment. The implementation of the semiconductor field effect transistor device 500 is similar to the implementation shown in FIG. 1. However, a field effect transistor structure is implemented at the main surface 102 of the semiconductor substrate. The field effect transistor structure comprises a plurality of first doping regions 110 representing a body area of the field effect transistor structure and source regions 510 surrounded by the first doping regions 110. The source regions 510 comprise the second conductivity type. Further, a gate 520 is arranged on the main surface 102 of the semiconductor substrate so that the gate 520 is able to cause a conductive channel between the source regions 510 and the emitter layer 120 through the first doping regions 110. More details and aspects are explained in connection with the described concept and the described embodiments (e.g. FIGS. 1 to 4).

Figure 5B:
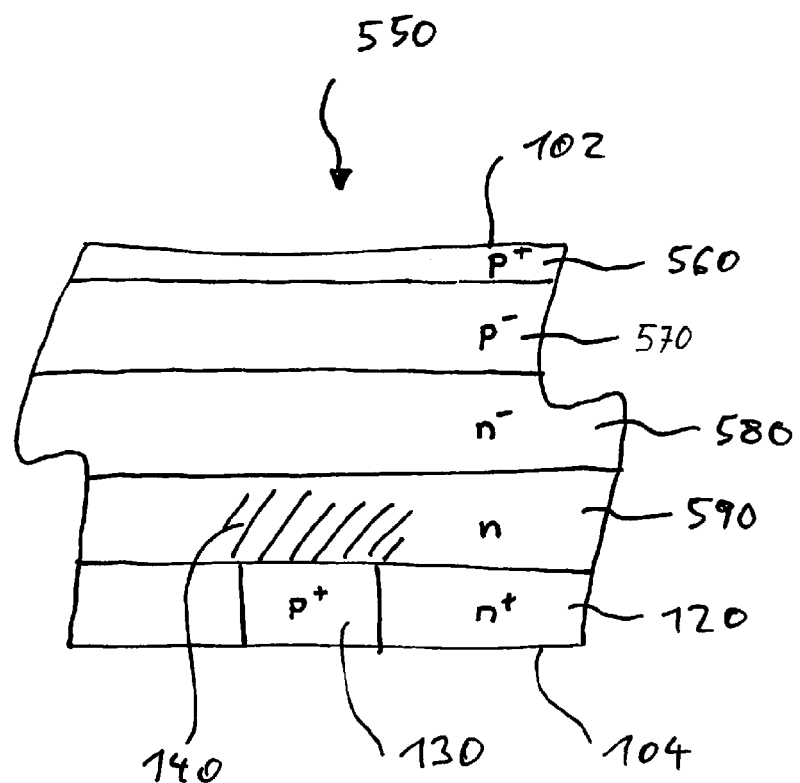
FIG. 5b shows a schematic cross-section of a part of a semiconductor device.

FIG. 5b shows a schematic illustration of a semiconductor diode device according to an embodiment. The implementation of the semiconductor diode device 550 is similar to the implementation shown in FIG. 1. The first doping region represents the anode of the semiconductor diode device 550 and comprises a highly p-doped (p+) layer arranged at the main surface 102 (e.g. to enable an Ohmic contact) and a lightly-doped (p−) layer 570 between the highly p-doped layer 560 and the second doping region. The second doping region comprises a lightly (n−) n-doped drift layer 580, a medium n-doped (n) field stop layer 590 and a highly n-doped (n+) part of the emitter layer 120. The at least one first conductivity type area 130 comprises a high p-doping (p+). More details and aspects are explained above (e.g. in connection with FIGS. 1 to 4).

FIG. 5b shows an example of a diode with p+ regions integrated in the back side emitter and an n region arranged before the p+ regions. The n region contains the region with two donors with deep energy states (impurities), optionally, additional donors with flat energy states (impurities) and optionally, additionally or also alternatively temperature-independent scattering centers, for example. In this way, an improved field charge extraction (FCE) may be implemented, for example.

Some embodiments relate to a power semiconductor device. In other words, a semiconductor device according to the described concept or one or more embodiments described above may comprise a blocking voltage of more than 100 V (e.g. between 100 V and 10000 V or more than 500 V, more than 1000 V or more than 4000 V).

Figure 6:
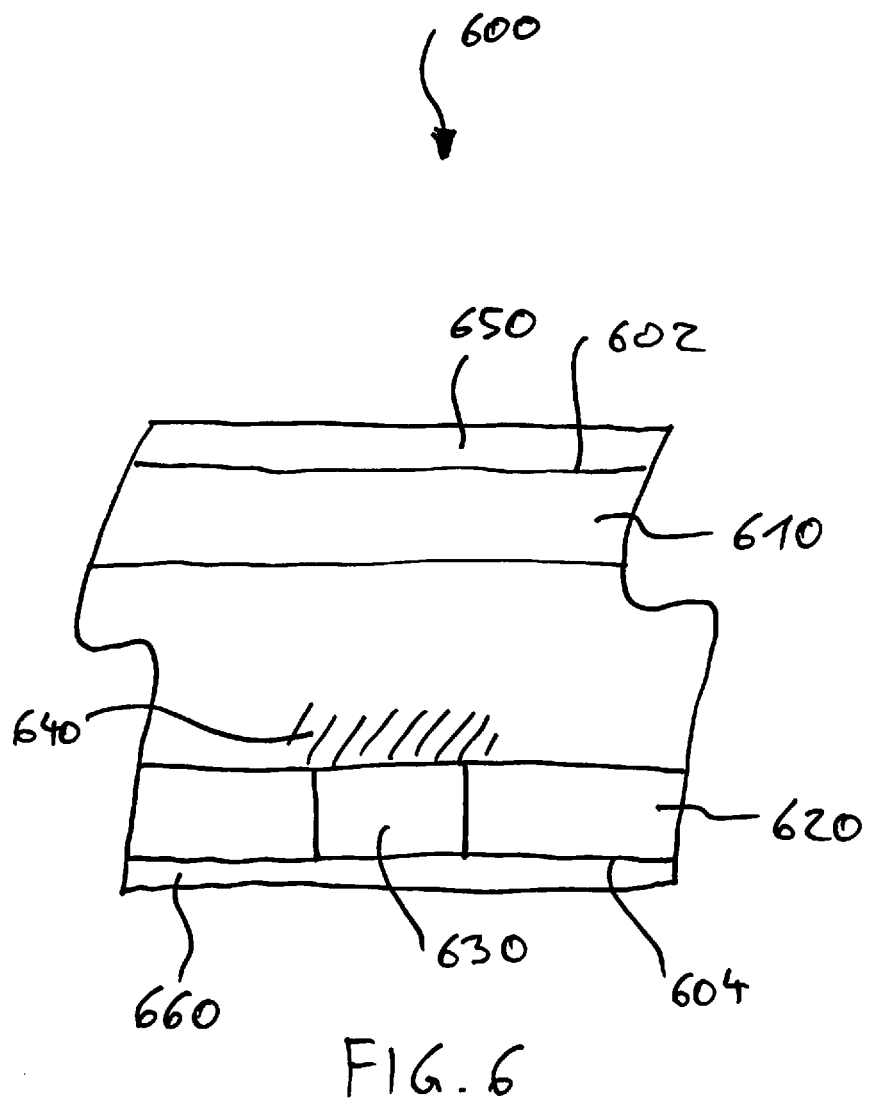
FIG. 6 shows a schematic cross-section of a part of a semiconductor device.

FIG. 6 shows a schematic illustration of a semiconductor diode device 600 with a semiconductor substrate according to an embodiment. The semiconductor substrate of the semiconductor diode device 600 comprises a first doping region 610 arranged at the main surface 602 of the semiconductor substrate, an emitter layer 620 arranged at the back side surface 604 of the semiconductor substrate, at least one first conductivity type area 630 located at the back side surface 604 within the emitter layer 620 and at least one temperature-stabilizing resistance area 640. The first doping region 610 is in contact with a front side metal layer 650 of the semiconductor diode device and comprises a first conductivity type. Further, the emitter layer 620 is in contact with a back side metal layer 660 of the semiconductor diode device 600 and comprises at least mainly a second conductivity type. The at least one first conductivity type area 630 comprises the first conductivity type and is separated from the first doping region 610 (e.g. implemented by a lateral layer) by a second doping region comprising the second conductivity type. The at least one temperature-stabilizing resistance area 640 is located within the second doping region (e.g. comprising a field stop layer and a drift layer of the diode and the part of the emitter layer comprising the second conductivity type) and adjacent to the at least one first conductivity type area 630. Further, the at least one temperature-stabilizing resistance area 640 comprises a doping causing energy states with a distance to the conduction band and to the valence band of the semiconductor material of the semiconductor substrate of more than 150 meV. Alternatively (or additionally), an average defect density within the at least one temperature-stabilizing resistance area is more than twice an average defect density within at least the part of the second doping region located adjacent to the at least one temperature-stabilizing resistance area 640.

By implementing the at least one first conductivity type area, the softness (e.g. reducing the fast changes of the current over time) during a switch-off process of a semiconductor device can be improved. This softness may be provided over a large temperature range by implementing at least one temperature-stabilizing resistance area adjacent to the at least one first conductivity type area. In this way, a soft switch-off behavior of the semiconductor device may be provided. Consequently, the durability or life cycle of the semiconductor device may be improved.

More details and aspects are described in connection with the proposed concept or one or more embodiments described above (e.g. FIGS. 1 to 4). The semiconductor diode device 600 may comprise one or more additional features corresponding ton one or more aspects described in connection with the proposed concept of one more embodiments described above.

Figure 7:
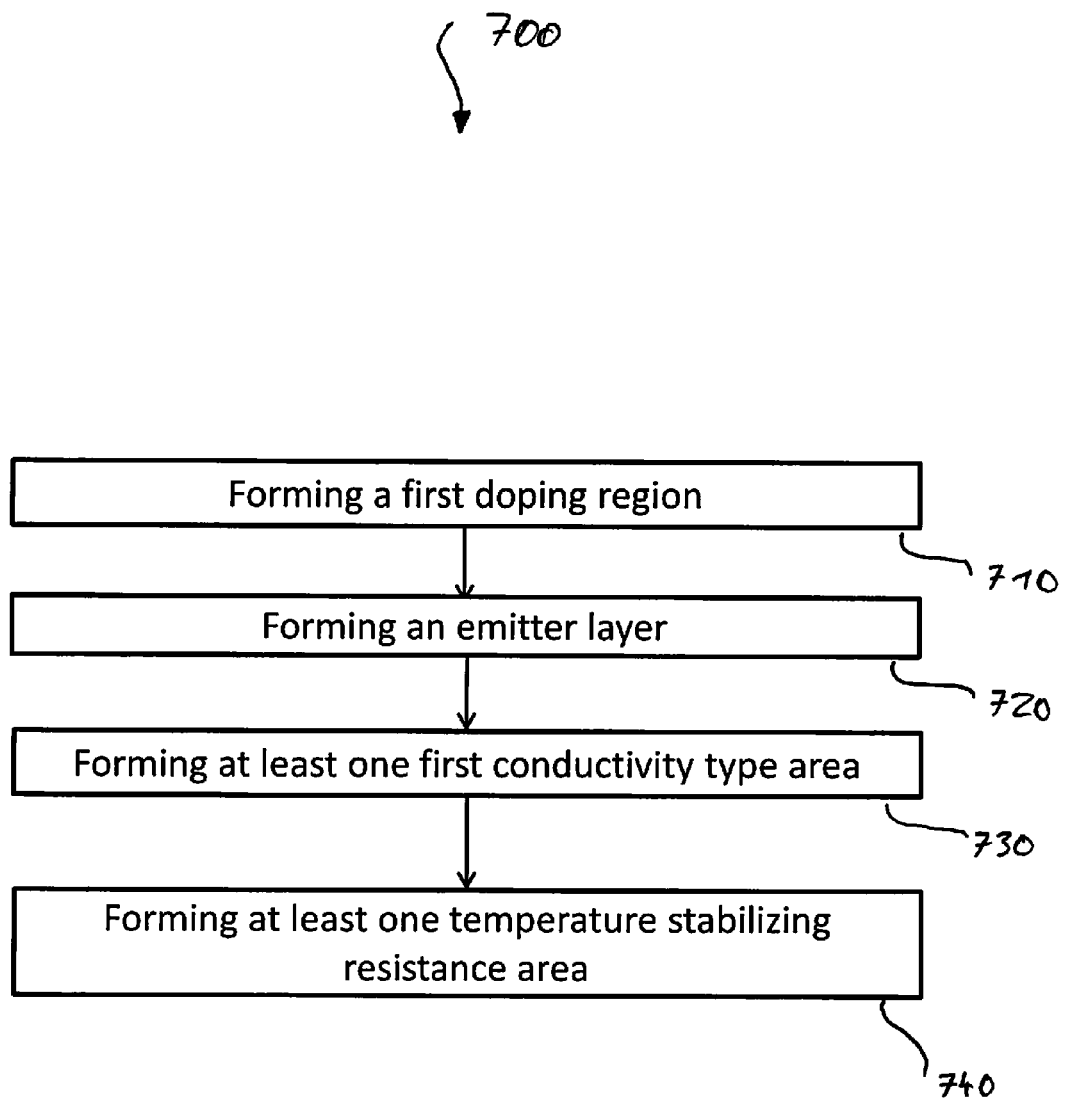
FIG. 7 shows a flowchart of a method for forming a semiconductor device.

FIG. 7 shows a flowchart of a method 700 for forming a semiconductor device with a semiconductor substrate according to an embodiment. The method 700 comprises forming 710 a first doping region arranged at a main surface of the semiconductor substrate and forming 720 an emitter layer arranged at the back side surface of the semiconductor substrate. The first doping region comprises a first conductivity type and the emitter layer comprises at least mainly a second conductivity type. Further, the method 700 comprises forming 730 at least one first conductivity type area separated from the first doping region by a second doping region of the semiconductor substrate and forming 740 at least one temperature-stabilizing resistance area. The second doping region comprises the second conductivity type and the at least one first conductivity type area comprises the first conductivity type. The at least one temperature-stabilizing resistance area is located within the second doping region and adjacent to the at least one first conductivity type area. Further, the at least one temperature-stabilizing resistance area comprises a lower variation of the resistance over a range of an operating temperature of the semiconductor device than at least a part of the second doping region located adjacent to the at least one temperature-stabilizing resistance area.

In this way, a semiconductor device with increased durability or life cycle can be implemented with low effort.

The method 700 may comprise one or more additional optional acts corresponding to one or more aspects mentioned in connection with the proposed concept or one or more embodiments described above.

Some embodiments relate to a diode with soft switch-off behavior. By implementing p-doped regions within an n-doped emitter and/or in the field stop layer of a diode, the softness during a switch-off process of high-power diodes may be significantly improved. These p-doped regions may adjoin directly to a back side metallization.

Without temperature-stabilizing areas, such measures may only be effective over a very limited temperature region, since the mobility within the n-doped zone located beneath the p-region in the range of the possible operating temperatures varies by approximately one order of magnitude and consequently also the lateral voltage drop along these p-regions, which defines the current density above which the desired whole injection of these p-doped regions start, for example.

Therefore, the p-doped regions (first conductivity type areas) can be placed in n-doped regions (temperature-stabilizing resistance area), which contain at least partly donors, which comprise one or more deep donor levels or states. This measure may result in an effective doping, which is increased in the n-doped zone (temperature-stabilizing resistance area) arranged before the p-doped regions with increasing temperature and consequently the negative temperature coefficient of the mobility, which is defined by the temperature-dependency of the scattering of free charge carriers at phonons, may be at least partly compensated or even overcompensated, for example.

A distance of the energy states to the conduction band edge (and the valence band edge) may be at least 200 meV, for example. Suitable dopants may be selenium atoms or sulfur atoms, for example.

It may be desired to keep the temperature-dependency of the softness as low as possible over the operation temperature range. Therefore, further donors with flat energy states (impurity) may be implemented in the regions arranged before the p-doped regions in addition to the donor atoms with deep energy states. The ratio of the implemented dose of atoms with deep and with flat energy states (impurities) within the semiconductor body may define or set the temperature-dependency.

For example, phosphor atoms or arsenic atoms may be used as donors with flat energy states or also defects, which may be generated by a proton exposure or irradiation with a following annealing, operating as donors may be used. These donors with deep and flat energy states may also build up a field stop zone which is arranged before the n-doped emitter and the p-doped regions (e.g. FIG. 5*b*). Further, these regions may also be part of the n-doped emitter, for example.

The donors may be integrated by ion implantation in combination with an annealing act (e.g. rapid terminal annealing, RTA) or also by laser processes. The usage of laser processes may enable the implementation of relatively high doping concentrations of donors with deep energy states in order to vary the temperature-dependency of the doping activity over a wide range, since the temperature-dependency of the activation of the donors increases with increasing doping (e.g. large degrees of freedom at the control of the temperature coefficient can be obtained in this way). Also a combination of force through acts and laser processes may be possible so that the n-doped regions with deep energy states (impurities) and n-doped regions with flat energy states extend over different depths (these ranges may also overlap). For example, a zone close to the surface with deep donors may be implemented or generated by laser annealing or suitable force through acts whose depth of penetration may lie between 0.3 and 3 µm, for example, and additionally an n-doped zone with flat donors generated by proton exposure, for example, whose depth of penetration may lie between 5 and 50 µm, for example. The resulting doping profile may be defined or set by the proton dose, the proton energy and the annealing. Also a multiple implantation with multiple energies and doses may be possible.

The portion of donors with flat energy states can be considered or selected so that sufficient effective doping is available at the lowest possible operation temperatures in order to avoid a punching of the depletion zone and the p-doped regions and in this way also undesired largely-increased leakage currents, for example.

P-doped injection regions adjacent to the back side metal with n-doped regions arranged before the p-doped regions may be used, which comprise donors with energy states located deep within the band gap in order to provide a soft switch-off behavior over the whole operation temperature range of the device. Additional donors with flat energy states can be integrated in these n-doped regions in order to enable a fine-tuning of the temperature-dependency, for example.

Additionally or alternatively, the mobility of the free charge carriers in the regions arranged before the p-doped regions can be reduce targeted by a defined generation of largely temperature-independent scattering centers, for example. These temperature-independent scattering centers may cause a significant reduction of the influence of the scattering of free charge carriers at phonons. The resulting effective mobility may be given by the reciprocal sum of the individual mobilities.

The doping concentration in the n-doped regions arranged before the p-doped regions may be increased correspondingly in order to obtain nearly equal voltage drops beneath the p-regions at equal switching conditions, for example.

Such a reduction of the mobility of the free charge carriers by a targeted scattering center generation can be implemented by a masked or an all-over helium irradiation, for example. Alternatively, also other highly-energetic particles, such as carbon, oxygen or protons may be used for the irradiation.

The strength of the reduction of the mobility can be defined or set in this case by the irradiation dose and the annealing condition of the annealing acts done after the irradiation for defect stabilization, for example.

The reduction of the mobility of the free charge carriers may be done beneath the p-doped regions, if the irradiation is performed masked.

Also other methods for local or all-over reduction of the mobility of the free charge carriers may be used for the implementation of the proposed concept as for example the integration of non-doping (e.g. germanium) or contrary doping impurities or foreign particles.

The described combinations of measures for reducing the temperature-dependency of the softness of the diode may be implemented also at floatingly-arranged p-doped regions buried in the n-doped zone, for example.

The temperature-dependency of the whole injection can be formed or selected by a correspondingly-selected combination of deep and shallow energy states (impurities) so that a nearly temperature-independent softness of the diode can be obtained during the switch-off process.

One aspect is a combination of the method or the structure with a targeted mobility reduction for a further reduction of the temperature-dependency of the softness, for example.

For the implementation of the proposed concept, or a proposed device, a one-step annealing may be sufficient (a two-step annealing may be avoided), for example.

Embodiments may further provide a computer program having a program code for performing one of the above methods, when the computer program is executed on a computer or processor. A person of skill in the art would readily recognize that steps of various above-described methods may be performed by programmed computers. Herein, some embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. The embodiments are also intended to cover computers programmed to perform the acts of the above-described methods or (field) programmable logic arrays ((F) PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. A semiconductor device with a semiconductor substrate, wherein the semiconductor substrate comprises:
    a first doping region arranged at a main surface of the semiconductor substrate, wherein the first doping region comprises a first conductivity type;
    an emitter layer arranged at a back side surface of the semiconductor substrate, wherein the emitter layer comprises at least mainly a second conductivity type;
    at least one first conductivity type area separated from the first doping region by a second doping region of the semiconductor substrate, wherein the second doping region comprises the second conductivity type and the at least one first conductivity type area comprises the first conductivity type; and
    at least one temperature stabilizing resistance area located within the second doping region and adjacent to the at least one first conductivity type area, wherein the at least one temperature stabilizing resistance area comprises a lower variation of a resistance over a range of an operating temperature of the semiconductor device than at least a part of the second doping region located adjacent to the at least one temperature stabilizing resistance area,
    wherein the at least one temperature stabilizing resistance area comprises a doping causing energy states with a distance to the conduction band and to the valence band of the semiconductor material of the semiconductor substrate of more than 150 meV.

2. The semiconductor device according to claim 1, wherein the at least one temperature stabilizing resistance area comprises a doping of a chemical element causing at least two different energy states with a distance to the conduction band and to the valence band of the semiconductor material of the semiconductor substrate of more than 150 meV.

3. The semiconductor device according to claim 1, wherein the at least one temperature stabilizing resistance area comprises a doping of selenium, sulfur or indium.

4. The semiconductor device according to claim 1, wherein the doping of atoms causing energy states with a distance to the conduction band and to the valence band of the semiconductor material of the semiconductor substrate of more than 150 meV reaches into a depth between 0.3 µm and 40 µm from the back side surface.

5. The semiconductor device according to claim 1, wherein the at least one temperature stabilizing resistance area further comprises a doping causing energy states with a distance to the conduction band or to the valence band of the semiconductor material of the semiconductor substrate of less than 100 meV.

6. The semiconductor device according to claim 5, wherein the at least one temperature stabilizing resistance area comprises a doping of phosphor, arsenic, aluminum or boron.

7. The semiconductor device according to claim 5, wherein the doping of atoms causing energy states with a distance to the conduction band and to the valence band of the semiconductor material of the semiconductor substrate of less than 100 meV reaches into a depth between 0.3 µm and 40 µm from the back side surface.

8. The semiconductor device according to claim 5, wherein between 20% and 80% of dopants of the doping of the at least one temperature stabilizing resistance area cause energy states with a distance to the conduction band and to the valence band of the semiconductor material of the semiconductor substrate of more than 150 meV.

9. The semiconductor device according to claim 1, wherein an average defect density within the at least one temperature stabilizing resistance area is more than twice an average defect density within at least the part of the second doping region located adjacent to the at least one temperature stabilizing resistance area.

10. The semiconductor device according to claim 9, wherein an average doping concentration within the at least one temperature stabilizing resistance area is more than twice a doping concentration within at least the part of the second doping region located adjacent to the at least one temperature stabilizing resistance area.

11. The semiconductor device according to claim 1, wherein the at least one first conductivity type area is located within the emitter layer at the back side surface of the semiconductor substrate.

12. The semiconductor device according to claim 1, comprising a field stop layer adjacent to the emitter layer, wherein the at least one first conductivity type area reaches from the back side surface of the semiconductor substrate to the field stop layer.

13. The semiconductor device according to claim 1, wherein the at least one first conductivity type area is completely enclosed by the second doping region of the semiconductor substrate.

14. The semiconductor device according to claim 1, wherein the at least one temperature stabilizing resistance area is located adjacent to the at least one first conductivity type area and at least at a side of the at least one first conductivity type area arranged towards the main surface of the semiconductor substrate.

15. The semiconductor device according to claim 1, wherein the second doping region comprises at least a field stop layer arranged adjacent to the emitter layer and a drift layer arranged between the field stop layer and the first doping region.

16. The semiconductor device according to claim 1, implementing a semiconductor diode device or a semiconductor field effect transistor device.

17. The semiconductor device according to claim 1, comprising a blocking voltage of more than 100V.

18. A semiconductor diode device with a semiconductor substrate, wherein the semiconductor substrate comprises:
    a first doping region arranged at a main surface of the semiconductor substrate and in contact with a front side metal layer of the semiconductor diode device, wherein the first doping region comprises a first conductivity type;
    an emitter layer arranged at a back side surface of the semiconductor substrate and in contact with a back side metal layer of the semiconductor diode device, wherein the emitter layer comprises at least mainly a second conductivity type;
    at least one first conductivity type area located at the back side surface within the emitter layer, wherein the at least one first conductivity type area comprises the first conductivity type, wherein the at least one first conductivity type area is separated from the first doping region by a second doping region comprising the second conductivity type; and at least one temperature stabilizing resistance area located within the second doping region and adjacent to the at least one first conductivity type area, wherein the at least one temperature stabilizing resistance area comprises a doping causing energy states with a distance to the conduction band and to the valence band of the semiconductor material of the semiconductor substrate of more than 150 meV or an average defect density within the at least one temperature stabilizing resistance area is more than twice an average defect density within at least the part of the second doping region located adjacent to the at least one temperature stabilizing resistance area.

* * * * *